United States Patent
Taniguchi

(10) Patent No.: US 7,106,114 B2
(45) Date of Patent: Sep. 12, 2006

(54) DELAY TIME ADJUSTING METHOD OF DELAYING A PHASE OF AN OUTPUT SIGNAL UNTIL A PHASE DIFFERENCE BETWEEN AN INPUT SIGNAL AND THE OUTPUT SIGNAL BECOMES AN INTEGRAL NUMBER OF PERIODS OTHER THAN ZERO

(75) Inventor: Nobutaka Taniguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/777,897

(22) Filed: Feb. 7, 2001

(65) Prior Publication Data

US 2001/0015664 A1    Aug. 23, 2001

(30) Foreign Application Priority Data

Feb. 23, 2000    (JP) .............................. 2000-046225

(51) Int. Cl.
*H03L 7/06*    (2006.01)

(52) U.S. Cl. ...................................... 327/158; 327/161

(58) Field of Classification Search ............... 327/263, 327/158, 161, 162, 163, 170, 175, 270–271, 327/276, 284, 153; 375/226, 373, 371, 375, 375/376; 331/1 A, 1 R, 25, 17; 365/233
See application file for complete search history.

(56) References Cited

U.S. PATENT DOCUMENTS

| 6,028,816 | A | * | 2/2000 | Takemae et al. | ............ 365/233 |
| 6,066,969 | A | * | 5/2000 | Kawasaki et al. | .......... 327/158 |
| 6,069,508 | A | * | 5/2000 | Takai | .......... 327/161 |
| 6,100,735 | A | * | 8/2000 | Lu | ............... 327/158 |
| 6,249,188 | B1 | * | 6/2001 | Kaneko | ...................... 331/1 A |

* cited by examiner

*Primary Examiner*—Linh My Nguyen
(74) *Attorney, Agent, or Firm*—Arent Fox, PLLC.

(57) ABSTRACT

A delay time adjusting method adjusts a delay time of an input signal so that a phase of the input signal and a phase of an output signal match each other. The delay time adjusting method comprises the step of delaying the phase of the output signal until a phase difference between the phase of the input signal and the phase of the output signal becomes N periods, where N is an integer other than zero.

5 Claims, 11 Drawing Sheets

FIG. 8
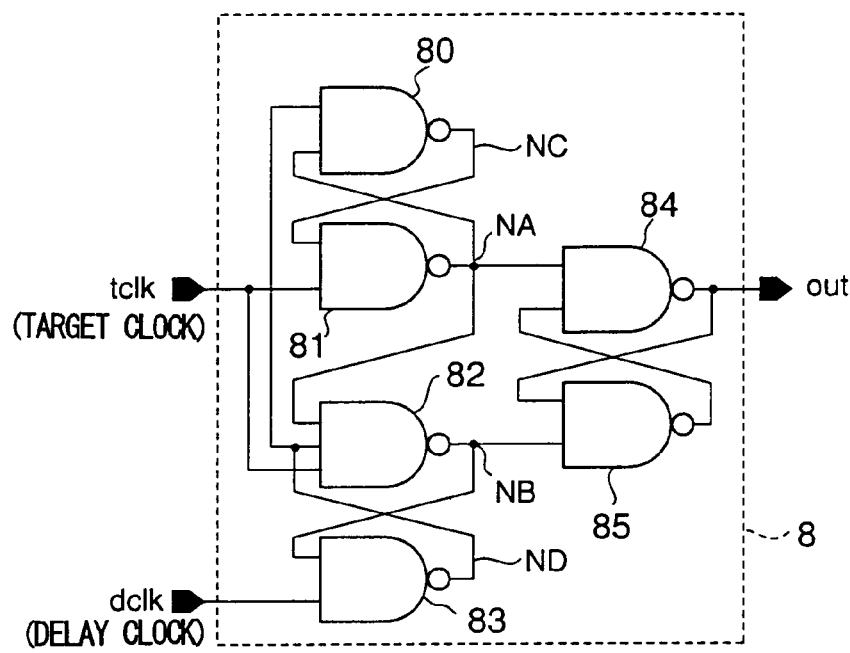
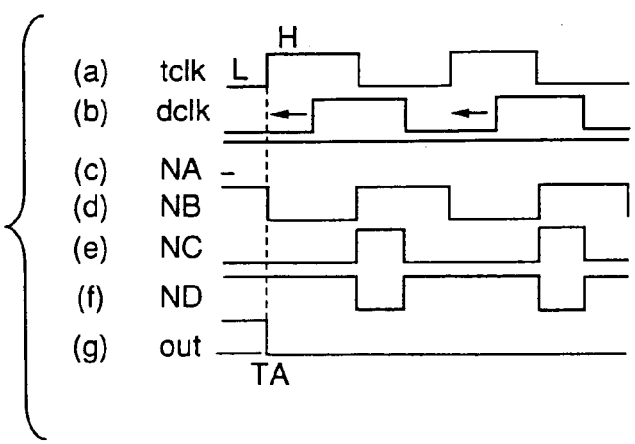
FIG. 9

DELAY TIME ADJUSTING METHOD OF DELAYING A PHASE OF AN OUTPUT SIGNAL UNTIL A PHASE DIFFERENCE BETWEEN AN INPUT SIGNAL AND THE OUTPUT SIGNAL BECOMES AN INTEGRAL NUMBER OF PERIODS OTHER THAN ZERO

BACKGROUND OF THE INVENTION

1. Field of the Invention

The present invention generally relates to a delay time adjusting circuit and, more particularly, to a delay time adjusting circuit and a delay time adjusting method which circuit and method adjust a delay time of a signal transmitted in a semiconductor integrated circuit.

2. Description of the Related Art

Conventionally, a semiconductor integrated circuit, such as a DDR (Double Data Rate)-SDRAM, which is required to operate at high speed and has a DLL (Delay Locked Loop) circuit mounted thereon, comprises a delay time adjusting circuit to adjust a phase of a clock signal.

FIG. 1 is a circuit diagram of a conventional delay time adjusting circuit. As shown in FIG. 1, the conventional delay time adjusting circuit comprises an input buffer 1, an output buffer 5, frequency dividers 2 and 4, a DLL array 3, a dummy circuit 6, a phase comparator 8 and a delay adjuster 10.

In this conventional delay time adjusting circuit, a clock signal is input into the input buffer 1, which outputs a signal Cin. The frequency divider 2 and the DLL array 3 are connected to the input buffer 1. The frequency divider 4 and the output buffer 5 are connected to an output terminal of the DLL array 3. The frequency divider 2 outputs a target clock signal tclk. The DLL array 3 outputs a signal Cout. The output buffer 5 outputs a clock signal delayed by the DLL array 3. The frequency division rates of the frequency dividers 2 and 4 are equal.

The dummy circuit 6 is connected to the frequency divider 4 and outputs a delay clock signal dclk. The phase comparator 8 is connected to the frequency divider 2 and an output terminal of the dummy circuit 6, and feeds back a result signal 'out' to the delay adjuster 10, according to the supplied target clock signal tclk and the fed-back delay clock signal dclk. An output terminal of the delay adjuster 10 is connected to the DLL array 3. The delay adjuster 10 supplies a control signal CS to the DLL array 3.

FIG. 2 is a circuit diagram of the DLL array 3 shown in FIG. 1. As shown in FIG. 2, the DLL array 3 comprises a switching unit 31 including a plurality of parallel-connected switches SW1 to SWn, and inverters INV1 to INVn respectively arranged to correspond to the switches SW1 to SWn. Switching of the switches SW1 to SWn included in the switching unit 31 is controlled by the controlling signal CS supplied by the delay adjuster 10. The signal Cin is delayed by a time td in each of the inverters INV1 to INVn.

In the above-mentioned delay time adjusting circuit, supposing that a delay time at the input buffer 1 is d1 and a delay time at the output buffer 5 is d2, a delay time at the dummy circuit 6 is (d1+d2). Also, supposing that a delay time of the DLL array 3 is d3, the clock signal input into the input buffer 1 and consequently output from the output buffer 5 is delayed by a time (d1+d2+d3).

Also, supposing that delay times at the frequency dividers 2 and 4 are d4, the clock signal input into the input buffer 1 and then input into the phase comparator 8 as the target clock signal talk is delayed by a time (d1+d4). On the other hand, the clock signal input into the input buffer 1 and conse-quently input into the phase comparator 8 as the delay clock signal dclk is delayed by a time (d1+d3+d4+(d1+d2)).

Accordingly, a difference in the delay times between the target clock signal talk and the delay clock signal dclk is (d1+d2+d3). This difference equals the delay time (d1+d2+d3) of the clock signal input into the input buffer 1 and consequently output from the output buffer 5. Thereby, in order to match phases of the clock signal input into the input buffer 1 and the clock signal output from the output buffer 5, the delay adjuster 10 adjusts the delay time d3 of the DLL array 3 so that the difference (d1+d2+d3) in the delay times between the target clock signal talk and the delay clock signal dclk equals a time corresponding to a number n (1, 2 or other natural numbers) of clocks of the clock signal.

Next, a description will be given, with reference to FIG. 3, of an operation of the above-mentioned conventional delay time adjusting circuit shown in FIG. 1. FIG. 3 is a waveform diagram indicating the operation of the conventional delay time adjusting circuit shown in FIG. 1. First, a signal Cin indicated by FIG. 3-(a) is divided by four by the frequency divider 2, as indicated by FIG. 3-(b), and then is supplied to the phase comparator 8 as the target clock signal tclk. On the other hand, in the DLL array 3, the signal Cin is delayed by a predetermined time, generating a signal Cout indicated by FIG. 3-(c). Then, the signal Cout is divided by four by the frequency divider 4, generating a monitor clock signal mclk indicated by FIG. 3-(d).

Since the frequency dividers 2 and 4 are supposed to have the same structure, a delay time VD of the monitor clock signal mclk with respect to the target clock signal tclk means a delay time in the DLL array 3. It is noted that variable delay stages of the DLL array 3 are assumed to be minimum stages that provide a minimum delay time.

The monitor clock signal mclk is delayed by a fixed time FD regardless of a frequency thereof in the dummy circuit 6, generating a delay clock signal dclk indicated by FIG. 3(e). Then, phases of the delay clock signal dclk and the target clock signal tclk are compared in the phase comparator 8, which judges that the phase of the delay clock signal dclk is a time TD ahead of the phase of the target clock signal tclk. The phase comparator 8 supplies the delay adjuster 10 with a result signal 'out' indicating that the phase of the delay clock signal dclk is the time TD ahead of the phase of the target clock signal tclk.

Then, the delay adjuster 10 supplies the DLL array 3 with a control signal CS according to the result signal 'out'. Then, the delay time in the DLL array 3 is lengthened by the time TD. The above-mentioned operation generates a signal Lon, indicated by FIG. 3-(f), as a delay clock signal dclk so that the phase of the delay clock signal dclk is matched to the phase of the target clock signal tclk.

Next, a description will be given, with reference to FIG. 4, of an operation of the above-mentioned conventional delay time adjusting circuit shown in FIG. 1, in a case where a clock signal having a higher frequency is input into the input buffer 1, as a semiconductor integrated circuit is increasingly required to operate at high speed. FIG. 4 is a waveform diagram indicating the operation of the conventional delay time adjusting circuit shown in FIG. 1. In this case, a signal Cin indicated by FIG. 4-(a), which is supplied to the frequency divider 2 and the DLL array 3, has a higher frequency than the signal Cin indicated by FIG. 3-(a). The signal Cin indicated by FIG. 4-(a) is divided by four by the frequency divider 2, as in the case shown in FIG. 3, and then is supplied to the phase comparator 8 as a target clock signal tclk indicated by FIG. 4-(b). On the other hand, in the DLL array 3, the signal Cin is delayed by a predetermined time, generating a signal Cout indicated by FIG. 4-(c). Then, the signal Cout is divided by four by the frequency divider 4, generating a monitor clock signal mclk indicated by FIG. 4-(d).

Since the frequency dividers 2 and 4 are supposed to have the same structure, a delay time VD of the monitor clock signal mclk to the target clock signal tclk means a delay time in the DLL array 3. It is noted that the variable delay stages of the DLL array 3 are assumed to be minimum stages that provide a minimum delay time.

The monitor clock signal mclk is delayed by the fixed time FD regardless of a frequency thereof in the dummy circuit 6, generating a delay clock signal dclk indicated by FIG. 4-(e). Then, phases of the delay clock signal dclk and the target clock signal tclk are compared in the phase comparator 8.

However, as indicated by FIG. 4-(b) and FIG. 4-(e), when the frequency of the signal Cin is high, the sum of the delay time VD of the minimum stages in the DLL array 3 and the fixed time FD, which is fixed regardless of a frequency, delayed in the dummy circuit 6 may cause the phase of the delay clock signal dclk to be behind the phase of the target clock signal tclk.

There is a problem in this case that since the phase of the delay clock signal dclk is already behind the phase of the target clock signal tclk, the delay time in the DLL array 3 cannot be adjusted so that the phase of the delay clock signal dclk is matched to the phase of the target clock signal tclk by using a first clock of the target clock signal tclk as a target. A case like this is referred to as a so-called underflow state.

SUMMARY OF THE INVENTION

It is a general object of the present invention to provide an improved and useful delay time adjusting circuit and a delay time adjusting method in which circuit and method the above-mentioned problems are eliminated.

A more specific object of the present invention is to provide a delay time adjusting circuit and a delay time adjusting method which circuit and method can easily adjust a delay time of a signal even when the signal has a high frequency.

In order to achieve the above-mentioned objects, there is provided according to one aspect of the present invention a delay time adjusting method of adjusting a delay time of an input signal so that a phase of the input signal and a phase of an output signal match each other, the method comprising the step of:

delaying the phase of the output signal until a phase difference between the phase of the input signal and the phase of the output signal becomes N periods, where N is an integer other than zero.

According to the present invention, a degree of freedom can be enhanced when delaying the phase of the output signal so as to match the phases of the input signal and the output signal. Thus, the phases of the input signal and the output signal can be easily matched regardless of a frequency of the input signal.

Additionally, in the present invention, the delay time adjusting method may further comprise a step of producing the output signal by delaying the input signal by a DLL circuit. In this case, by changing the length of delay stages of the DLL circuit, the delay time of the input signal can be easily adjusted.

In order to achieve the above-mentioned objects, there is also provided according to another aspect of the present invention a delay time adjusting method of adjusting a delay time of an input first periodic signal so that a phase of the input first periodic signal and a phase of an output second periodic signal match each other, the method comprising the step of:

adjusting the delay time so that, when a phase of a predetermined rising edge of the output second periodic signal is behind a phase of a predetermined rising edge of the input first periodic signal, the predetermined rising edge of the output second periodic signal matches a rising edge of the input first periodic signal, a phase of the rising edge being behind and nearest to the phase of the predetermined rising edge of the output second periodic signal.

According to the present invention, when the phase of the predetermined rising edge of the output second periodic signal is, at an initial state, behind the phase of the predetermined rising edge of the input first periodic signal, the phases of the input first periodic signal and the output second periodic signal can be easily matched. Therefore, even when the input first periodic signal has a high frequency, the so-called underflow state, where a required phase adjustment is impossible, can be avoided, and thus the delay time adjusting method and circuit according to the present invention can be more general purpose and more reliable in operation.

In order to achieve the above-mentioned objects, there is also provided according to still another aspect of the present invention a delay time adjusting method of adjusting a delay time of an input first periodic signal so that a phase of the input first periodic signal and a phase of an output second periodic signal match each other, the method comprising:

a first step of judging whether a phase of a predetermined rising edge of the output second periodic signal is behind a phase of a first rising edge of the input first periodic signal; and a second step of delaying the phase of the output second periodic signal so that, when the phase of the predetermined rising edge is judged to be behind the phase of the first rising edge in the first step, the phase of the predetermined rising edge and a phase of a second rising edge of the input first periodic signal match each other, the second rising edge being one period behind the first rising edge.

According to the present invention, even when a frequency of the input first periodic signal becomes high and thus the phase of the predetermined rising edge of the output second periodic signal goes behind the phase of the first rising edge of the input first periodic signal, the phase of the output second periodic signal can be matched to the phase of the input first periodic signal. Therefore, the delay time adjusting method and circuit according to the present invention can be more general purpose and more reliable in operation.

In order to achieve the above-mentioned objects, there is also provided according to still another aspect of the present invention a delay time adjusting circuit for adjusting a delay time of an input first periodic signal so that a phase of the input first periodic signal and a phase of an output second periodic signal match each other, the circuit comprising:

delaying means for delaying the input first periodic signal so as to generate the output second periodic signal;

phase-detecting means for detecting whether a phase of a predetermined rising edge of the output second periodic signal is behind a phase of a first rising edge of the input first periodic signal; and adjusting means for controlling the delaying means so that, when the phase of the predetermined rising edge is judged to be behind the phase of the first rising edge by the phase-detecting means, the delaying means delays the phase of the output second periodic signal until the phase of the predetermined rising edge and a phase of a second rising edge of the input first periodic signal match each other, the second rising edge being one period behind the first rising edge.

Additionally, in the present invention, the adjusting means may control the delaying means so that, after the phase of the predetermined rising edge and the phase of the second rising edge match each other, the phase of the predetermined rising edge and the phase of the second rising edge match each other all the time within a tolerable range.

According to the present invention, the output second periodic signal having a phase matching a phase of the input first periodic signal can be steadily output. Therefore, the delay time adjusting method and circuit according to the present invention can be more reliable in operation.

Other objects, features and advantages of the present invention will become more apparent from the following detailed description when read in conjunction with the accompanying drawings.

BRIEF DESCRIPTION OF THE DRAWINGS

FIG. 8 is a circuit diagram of a phase comparator shown in FIG. 5;

FIG. 9 is a waveform diagram indicating an operation of the phase comparator shown in FIG. 8 in a case where a first clock of a delay clock signal is behind a first clock of a target clock signal;

DETAILED DESCRIPTION OF THE PREFERRED EMBODIMENTS

Figure 1:
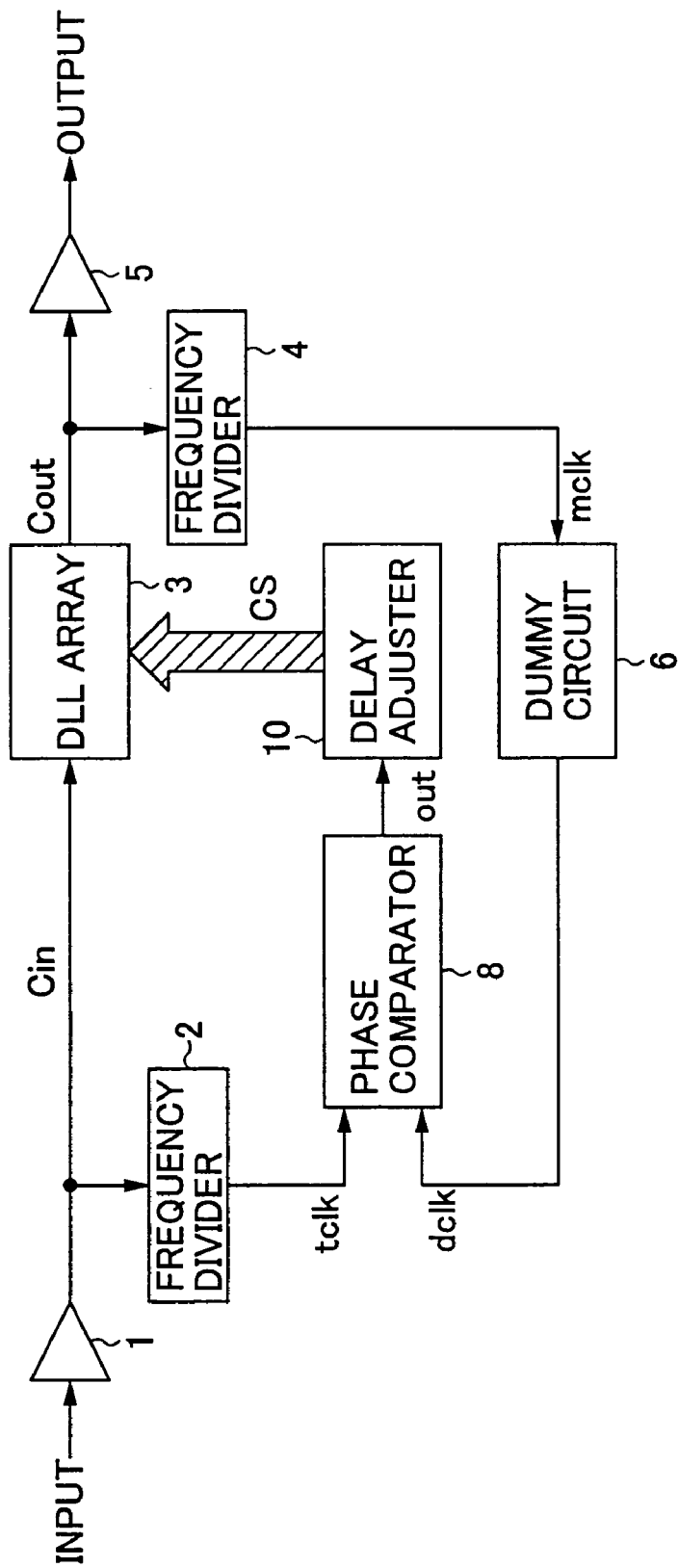
FIG. 1 is a circuit diagram of a conventional delay time adjusting circuit.
Figure 2:
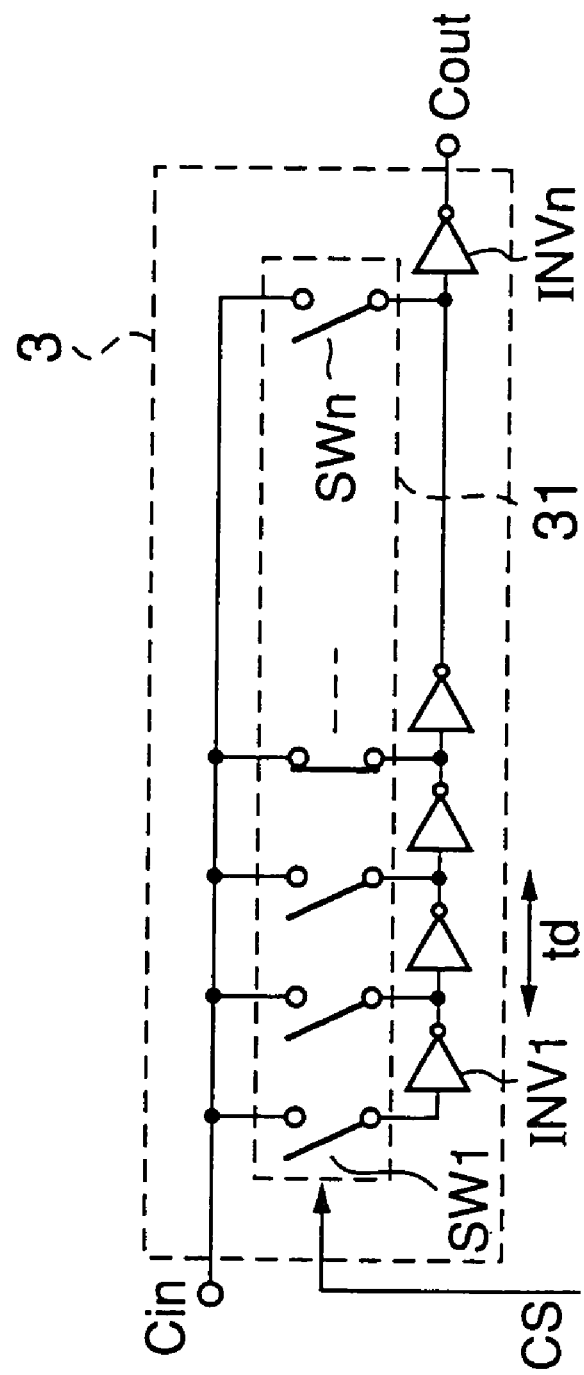
FIG. 2 is a circuit diagram of a DLL (Delay Locked Loop) array shown in FIG. 1.
Figure 3:
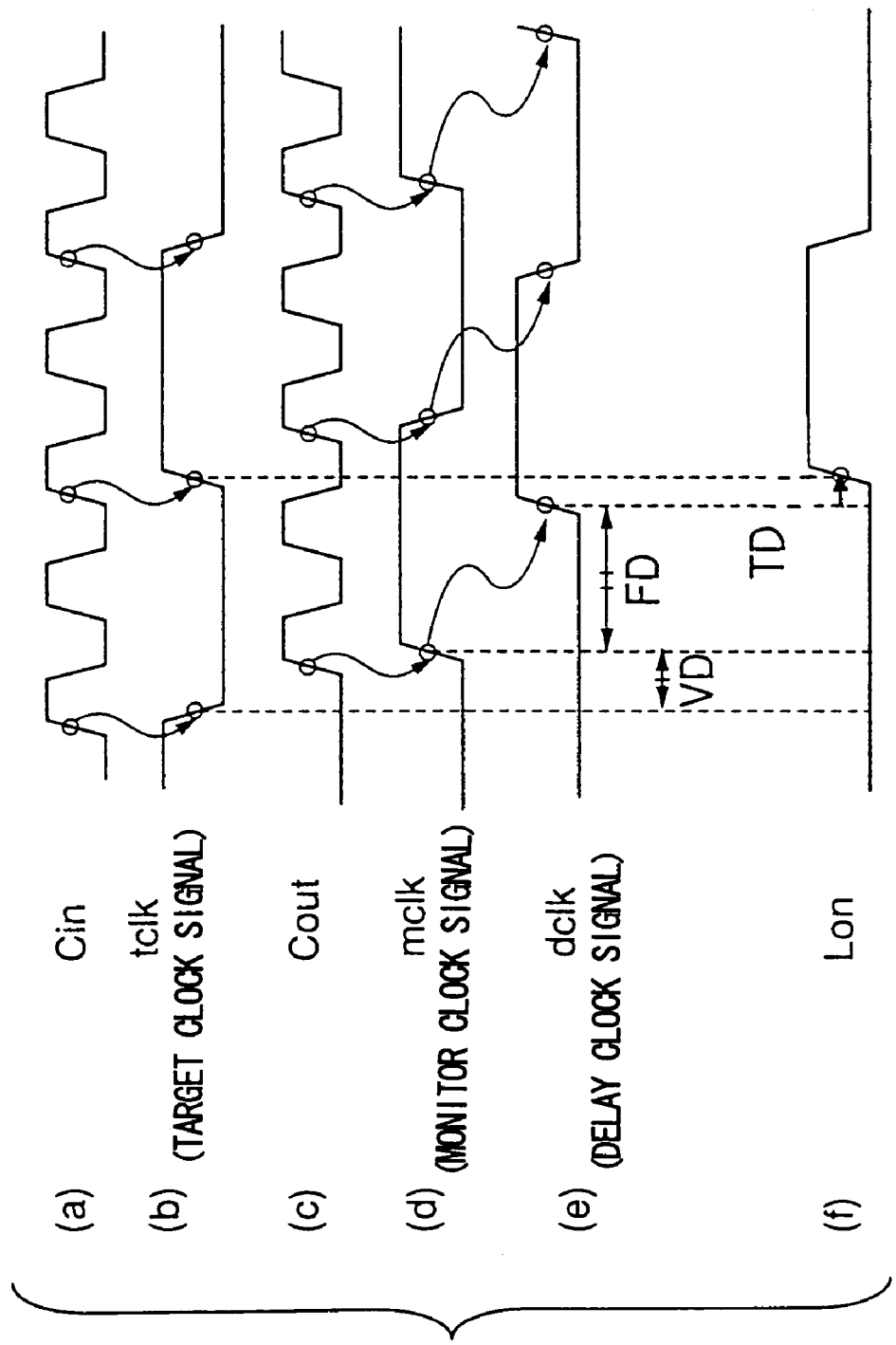
FIG. 3 is a first waveform diagram indicating an operation of the conventional delay time adjusting circuit shown in FIG. 1.
Figure 4:
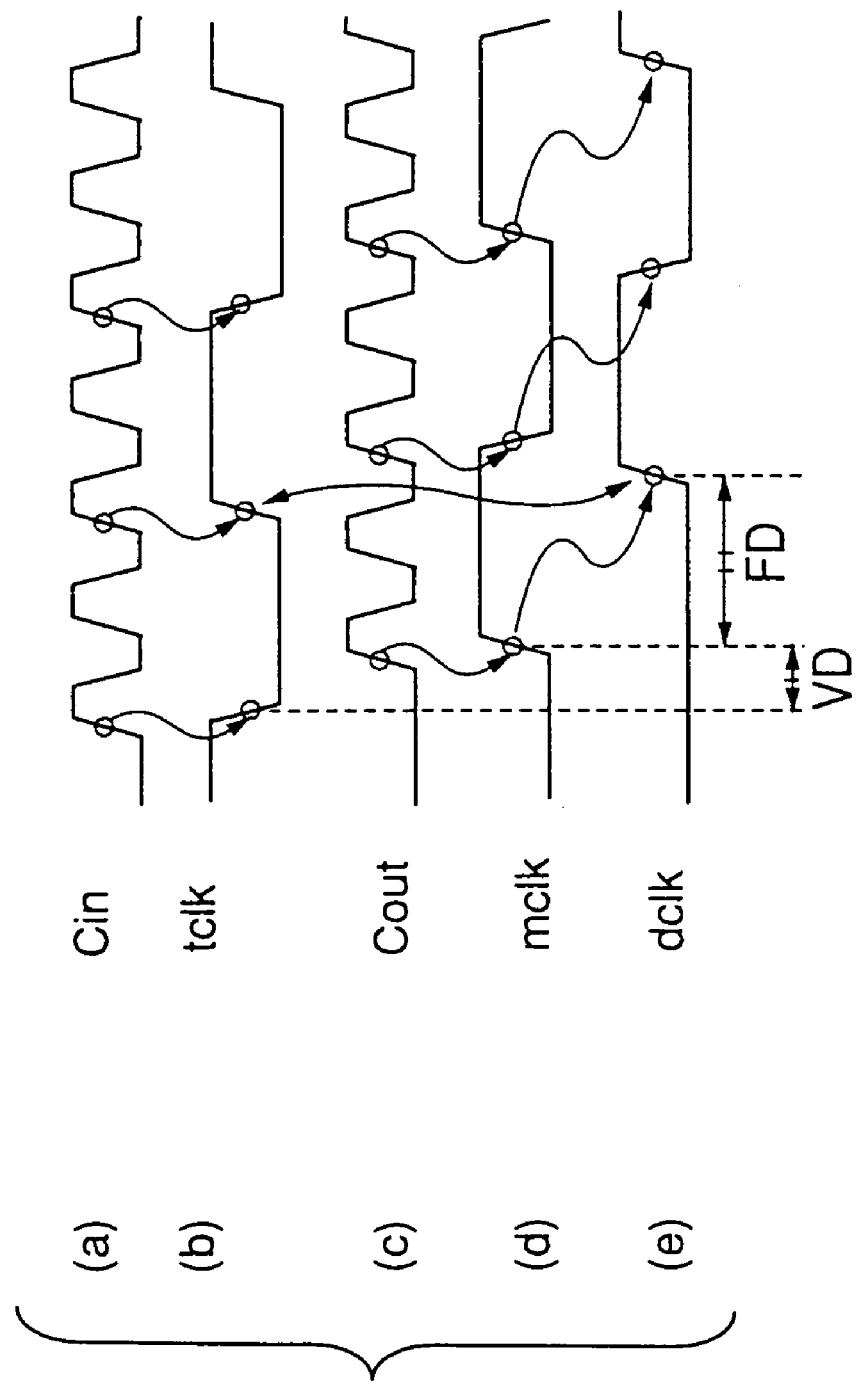
FIG. 4 is a second waveform diagram indicating an operation of the conventional delay time adjusting circuit shown in FIG. 1.

A description will now be given, with reference to the drawings, of embodiments according to the present invention. Elements in the drawings that are identical or equivalent are referenced by the same characters.

Figure 5:
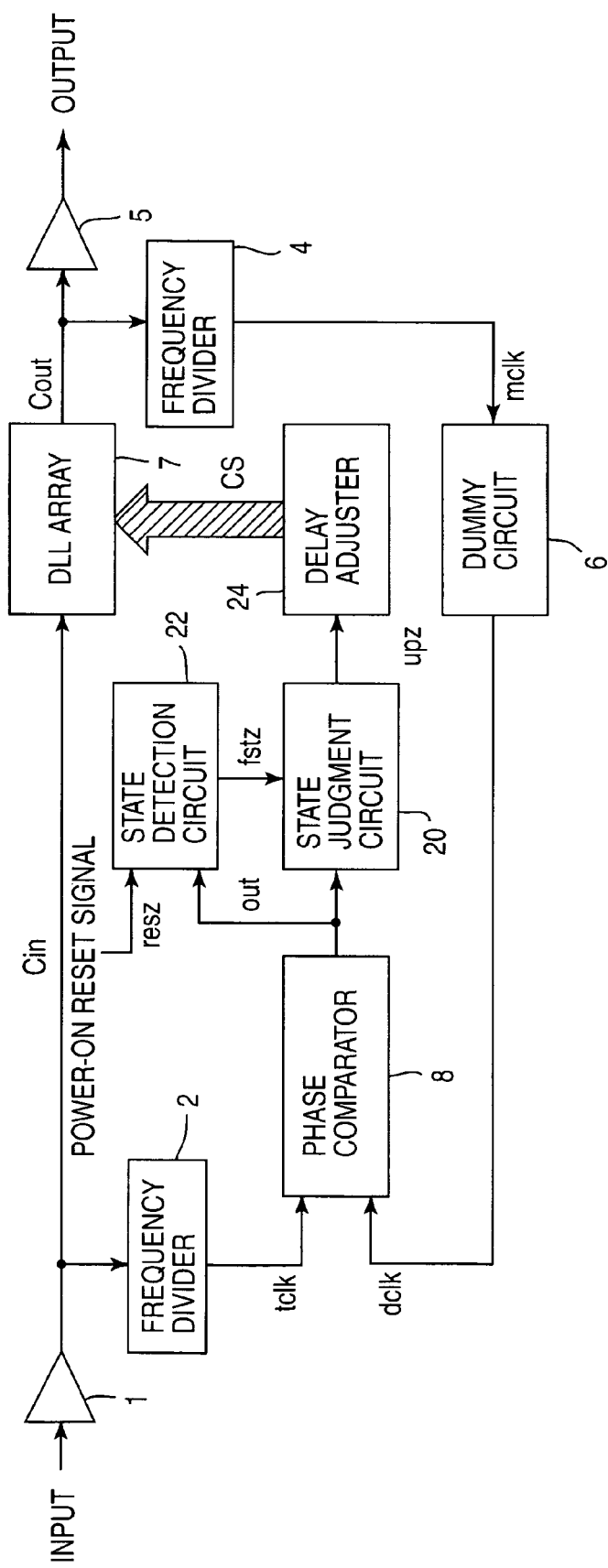
FIG. 5 is a circuit diagram of a delay time adjusting circuit according to an embodiment of the present invention.

FIG. 5 is a circuit diagram of a delay time adjusting circuit according to an embodiment of the present invention. As shown in FIG. 5, the delay time adjusting circuit according to the present embodiment comprises the input buffer 1, the output buffer 5, the frequency dividers 2 and 4, a DLL array 7, the dummy circuit 6, the phase comparator 8, a delay adjuster 24, a state judgment circuit 20 and a state detection circuit 22.

It should be noted that the frequency divider 2 may be considered to be an element that determines a target used in adjusting a phase of a signal. The second frequency divider 4 may be considered to be an element that determines how frequently the phase of a signal has a chance to be adjusted.

In the above-mentioned delay time adjusting circuit, a clock signal is input into the input buffer 1. The frequency divider 2 and the DLL array 7 are connected to the input buffer 1. The frequency divider 4 and the output buffer 5 are connected to an output terminal of the DLL array 7. The frequency divider 2 outputs the target clock signal tclk. The dummy circuit 6 is connected to the frequency divider 4 and outputs the delay clock signal dclk. The phase comparator 8 is connected to the frequency divider 2 and the output terminal of the dummy circuit 6, and supplies the result signal 'out' indicating a result of a phase comparison to the state judgment circuit 20 and the state detection circuit 22.

The state detection circuit 22 receives a power-on reset signal resz activated to a high level when the DLL array 7 starts a delay time adjustment, and supplies a state detection result signal fstz to the state judgment circuit 20. The state judgment circuit 20 supplies a comparison result signal upz to the delay adjuster 24. An output terminal of the delay adjuster 24 is connected to the DLL array 7, and the delay adjuster 24 supplies the control signal CS to the DLL array 7. Frequency division rates of the frequency dividers 2 and 4 are set to, for example, four. As mentioned hereinafter, the delay time adjusting circuit shown in FIG. 5 requires a smaller number of delay stages (the inverters INV1 to INVn) to be included in the DLL array 7 than that of a conventional technology.

Figure 6:
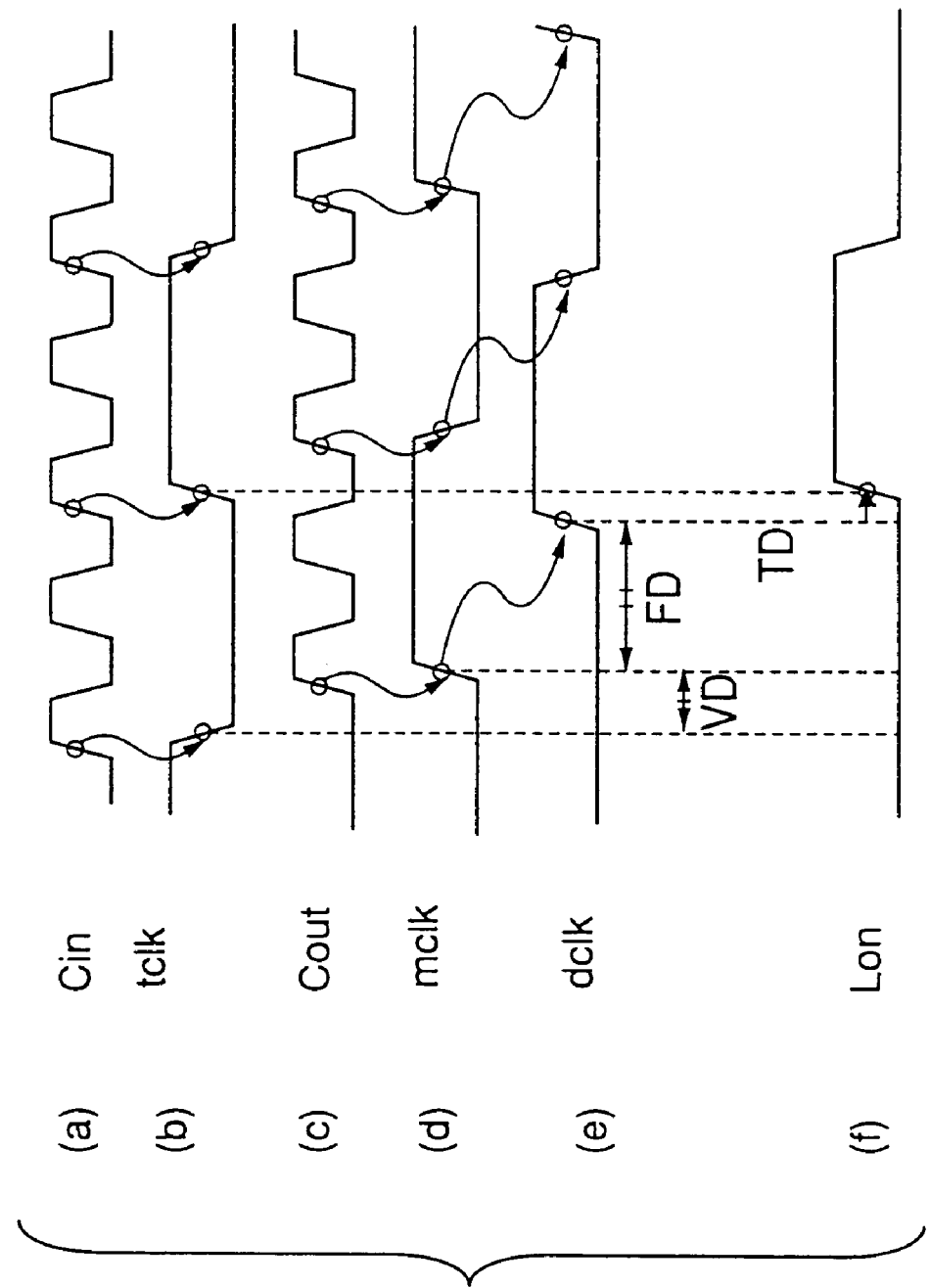
FIG. 6 is a first waveform diagram indicating an operation of the delay time adjusting circuit shown in FIG. 5.

Next, a description will be given, with reference to FIG. 6, of an operation of the above-mentioned delay time adjusting circuit shown in FIG. 5. FIG. 6 is a waveform diagram indicating the operation of the delay time adjusting circuit shown in FIG. 5. First, a signal Cin indicated by FIG. 6-(a) is divided by four by the frequency divider 2, as indicated by FIG. 6-(b), and then is supplied to the phase comparator 8 as the target clock signal tclk. On the other hand, in the DLL array 7, the signal Cin is delayed by a predetermined time, generating a signal Cout indicated by FIG. 6-(c). Then, the signal Cout is divided by four by the frequency divider 4, generating a monitor clock signal mclk indicated by FIG. 6-(d).

Since the frequency dividers 2 and 4 are supposed to have the same structure, a delay time VD of the monitor clock signal mclk to the target clock signal tclk means a delay time in the DLL array 7. It is noted that variable delay stages of the DLL array 7 are assumed to be minimum stages that provide a minimum delay time.

The monitor clock signal mclk is delayed by a fixed time FD regardless of a frequency thereof in the dummy circuit 6, generating a delay clock signal dclk indicated by FIG. 6-(e). Then, phases of the delay clock signal dclk and the target clock signal talk are compared in the phase comparator 8, which judges that the phase of the delay clock signal dclk is a time TD ahead of the phase of the target clock signal tclk. The phase comparator 8 supplies the state judgment circuit 20 and the state detection circuit 22 with a result signal 'out' indicating that the phase of the delay clock signal dclk is the time TD ahead of the phase of the target clock signal tclk.

At this time, the state detection circuit 22, as described in detail later, receives the power-on reset signal resz activated to a high level when the DLL array 7 starts a delay time adjustment, and supplies the state detection result signal fstz at a high level to the state judgment circuit 20. Thereby, the state judgment circuit 20, as described in detail later, supplies the comparison result signal upz at a high level to the delay adjuster 24.

The delay adjuster 24 supplies the DLL array 7 with the control signal CS according to the supplied comparison result signal upz at a high level. Then, the delay time in the DLL array 7 is lengthened by the time TD. The above-mentioned operation generates a signal Lon, indicated by FIG. 6-(f), as a delay clock signal dclk so that the phase of the delay clock signal dclk is matched to and locked on the phase of the target clock signal tclk. It is noted that "locking-on" means matching the phases of the delay clock signal dclk and the target clock signal tclk all the time within a tolerable range. It is also noted that the tolerable range here means, for example, a margin of an operating frequency that guarantees a normal operation in a specification of a semi-conductor integrated circuit on which the delay time adjusting circuit is mounted.

Figure 7:
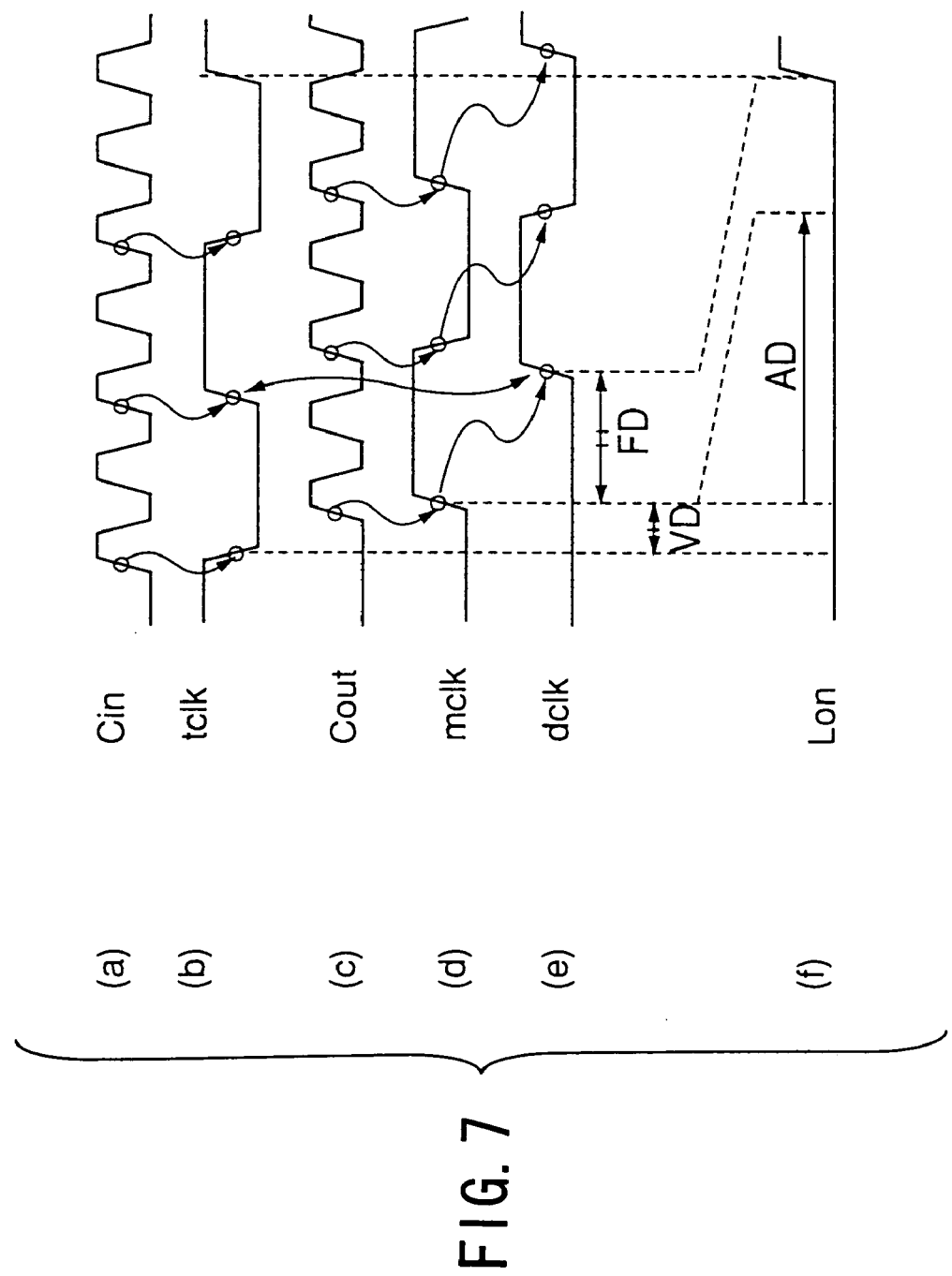
FIG. 7 is a second waveform diagram indicating an operation of the delay time adjusting circuit shown in FIG. 5.

Next, a description will be given, with reference to FIG. 7, of an operation of the above-mentioned delay time adjusting circuit shown in FIG. 5, in a case where a clock signal having a higher frequency is input into the input buffer 1, as a semiconductor integrated circuit is increasingly required to operate at high speed. FIG. 7 is a waveform diagram indicating the operation of the delay time adjusting circuit shown in FIG. 5. In this case, a signal Cin indicated by FIG. 7-(a), which is supplied to the frequency divider 2 and the DLL array 7, has a higher frequency than the signal Cin indicated by FIG. 6-(a). The signal Cin indicated by FIG. 7-(a) is divided by four by the frequency divider 2, as in the case shown in FIG. 6, and then is supplied to the phase comparator 8 as a target clock signal tclk indicated by FIG. 7-(b).

On the other hand, in the DLL array 7, the signal Cin is delayed by a predetermined time, generating a signal Cout indicated by FIG. 7-(c). Then, the signal Cout is divided by four by the frequency divider 4, generating a monitor clock signal mclk indicated by FIG. 7-(d).

Since the frequency dividers 2 and 4 are supposed to have the same structure, a delay time VD of the monitor clock signal mclk with respect to the target clock signal tclk means a delay time in the DLL array 7. It is noted that the variable delay stages of the DLL array 7 are assumed to be minimum stages that provide a minimum delay time.

The monitor clock signal mclk is delayed by the fixed time FD regardless of a frequency thereof in the dummy circuit 6, generating a delay clock signal dclk indicated by FIG. 7-(e). Then, phases of the delay clock signal dclk and the target clock signal tclk are compared in the phase comparator 8.

However, as indicated by FIG. 7-(b) and FIG. 7-(e), when the frequency of the signal Cin is high, the sum of the delay time VD of the minimum stages in the DLL array 7 and the fixed time FD, which is fixed regardless of a frequency, delayed in the dummy circuit 6 may cause the phase of the delay clock signal dclk to be behind the phase of the target clock signal tclk.

In this case, since the phase of the delay clock signal dclk is already behind the phase of the target clock signal talk, the delay time in the DLL array 7 cannot be adjusted so that the phase of the delay clock signal dclk is matched to the phase of the target clock signal talk by using a first rise (a transition from a low level to a high level, also referred to as "rising edge") of the target clock signal talk as a target.

At this time, the state detection circuit 22 shown in FIG. 5, regardless of a comparison result in the phase comparator 8, supplies the state detection result signal fstz at a high level to the state judgment circuit 20 according to the power-on reset signal resz supplied to the state detection circuit 22, as in the case shown in FIG. 6. Therefore, the state judgment circuit 20 supplies the comparison result signal upz at a high level to the delay adjuster 24. It is noted that the state detection circuit 22 and the state judgment circuit 20 are described in detail later.

Therefore, the delay adjuster 24 supplies the DLL array 7 with the control signal CS according to the supplied comparison result signal upz at a high level so as to lengthen the delay time in the DLL array 7.

By repeating the above-mentioned phase comparison and the lengthening of the delay time, the delay time in the DLL array 7 is further lengthened by a time AD so that a first clock (rise) of the delay clock signal dclk goes behind a second clock (rise) of the target clock signal tclk. At this point, the phase comparator 8 supplies a result signal 'out' at a low level to the state detection circuit 22. Subsequently, the state detection circuit 22 supplies a state detection result signal fstz at a low level to the state judgment circuit 20. Thereby, the state judgment circuit 20 is activated and supplies the delay adjuster 24 with the comparison result in the phase comparator 8 as a comparison result signal upz at a low level.

Then, the delay adjuster 24 supplies the DLL array 7 with a control signal CS according to the supplied comparison result signal upz at a low level so as to shorten the delay time in the DLL array 7. As a result of this, a signal Lon is generated as a delay clock signal dclk and locked on so that a first clock (rise) of the signal Lon is matched to the second clock (rise) of the target clock signal tclk, as indicated by FIG. 7-(f).

Hereinafter, a description will be given, with reference to FIG. 8 to FIG. 10, of the phase comparator 8 shown in FIG. 5. FIG. 8 is a circuit diagram of the phase comparator 8 shown in FIG. 5. As shown in FIG. 8, the phase comparator 8 comprises NAND circuits 80 to 85. The target clock signal tclk is supplied to the NAND circuits 81 and 82. The delay clock signal dclk is supplied to the NAND circuit 83. The result signal 'out' is output from an output terminal of the NAND circuit 84.

FIG. 9 is a waveform diagram indicating an operation of the above-mentioned phase comparator 8 in a case where a first clock of a delay clock signal dclk is behind a first clock of a target clock signal tclk. FIG. 9-(a) indicates the target clock signal tclk. FIG. 9-(b) indicates the delay clock signal dclk. FIG. 9-(c) indicates fluctuations of electric potential at an output node NA of the NAND circuit 81. FIG. 9-(d) indicates fluctuations of electric potential at an output node NB of the NAND circuit 82. FIG. 9-(e) indicates fluctuations of electric potential at an output node NC of the NAND circuit 80. FIG. 9-(f) indicates fluctuations of electric potential at an output node ND of the NAND circuit 83. FIG. 9-(g) indicates the result signal 'out'.

In the case shown in FIG. 9, where the first clock of the delay clock signal dclk is behind the first clock of the target clock signal tclk, before a so-called rise time TA of the target clock signal tclk, the NAND circuits 84 and 85 latch the result signal 'out' at a high level or a low level. Then, at the rise time TA when the target clock signal tclk rises to a high level, the electric potential at the output node NB falls to a low level, and consequently, the result signal 'out' is fixed at the low level. Thereby, the phase comparator 8 supplies the state detection circuit 22 and the state judgment circuit 20 with the result signal 'out' at the low level. That is, the phase comparator 8 supplies the state detection circuit 22 and the state judgment circuit 20 with the result signal 'out' indicating a judgment (decrease) that the first clock of the delay clock signal dclk is behind the first clock of the target clock signal tclk.

Figure 10:
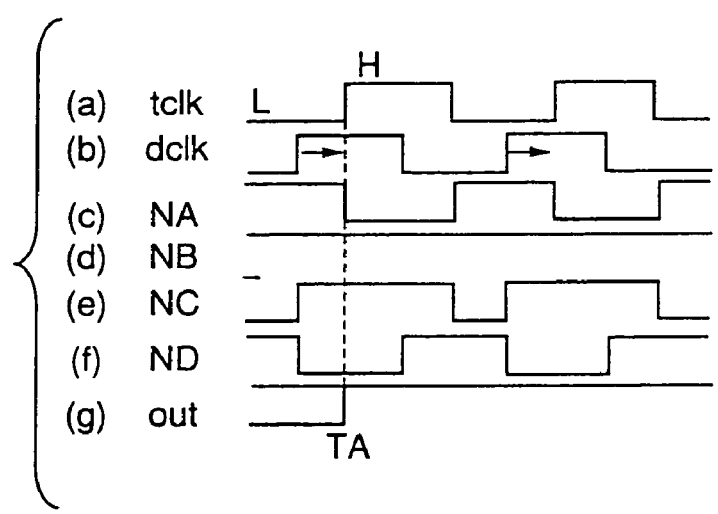
FIG. 10 is a waveform diagram indicating an operation of the phase comparator shown in FIG. 8 in a case where a first clock of a delay clock signal is ahead of a first clock of a target clock signal.

FIG. 10 is a waveform diagram indicating an operation of the above-mentioned phase comparator 8 in a case where a first clock of a delay clock signal dclk is ahead of a first clock of a target clock signal tclk. FIG. 10-(a) indicates the target clock signal tclk. FIG. 10-(b) indicates the delay clock signal dclk. FIG. 10-(c) indicates fluctuations of electric potential at the output node NA of the NAND circuit 81. FIG. 10-(d) indicates fluctuations of electric potential at the output node NB of the NAND circuit 82. FIG. 10-(e) indicates fluctuations of electric potential at the output node NC of the NAND circuit 80. FIG. 10-(f) indicates fluctuations of electric potential at the output node ND of the NAND circuit 83. FIG. 10-(g) indicates the result signal 'out'.

In the case shown in FIG. 10, where the first clock of the delay clock signal dclk is ahead of the first clock of the target clock signal tclk, before the rise time TA of the target clock signal tclk, the NAND circuits 84 and 85 latch the result signal 'out' at a high level or a low level. Then, at the rise time TA when the target clock signal tclk rises to a high level, the electric potential at the output node NA falls to a low level, and consequently, the result signal 'out' is fixed at the high level. Thereby, the phase comparator 8 supplies the state detection circuit 22 and the state judgment circuit 20 with the result signal 'out' at the high level. That is, the phase comparator 8 supplies the state detection circuit 22 and the state judgment circuit 20 with the result signal 'out' indicating a judgment (increase) that the first clock of the delay clock signal dclk is ahead of the first clock of the target clock signal tclk.

Figure 11:
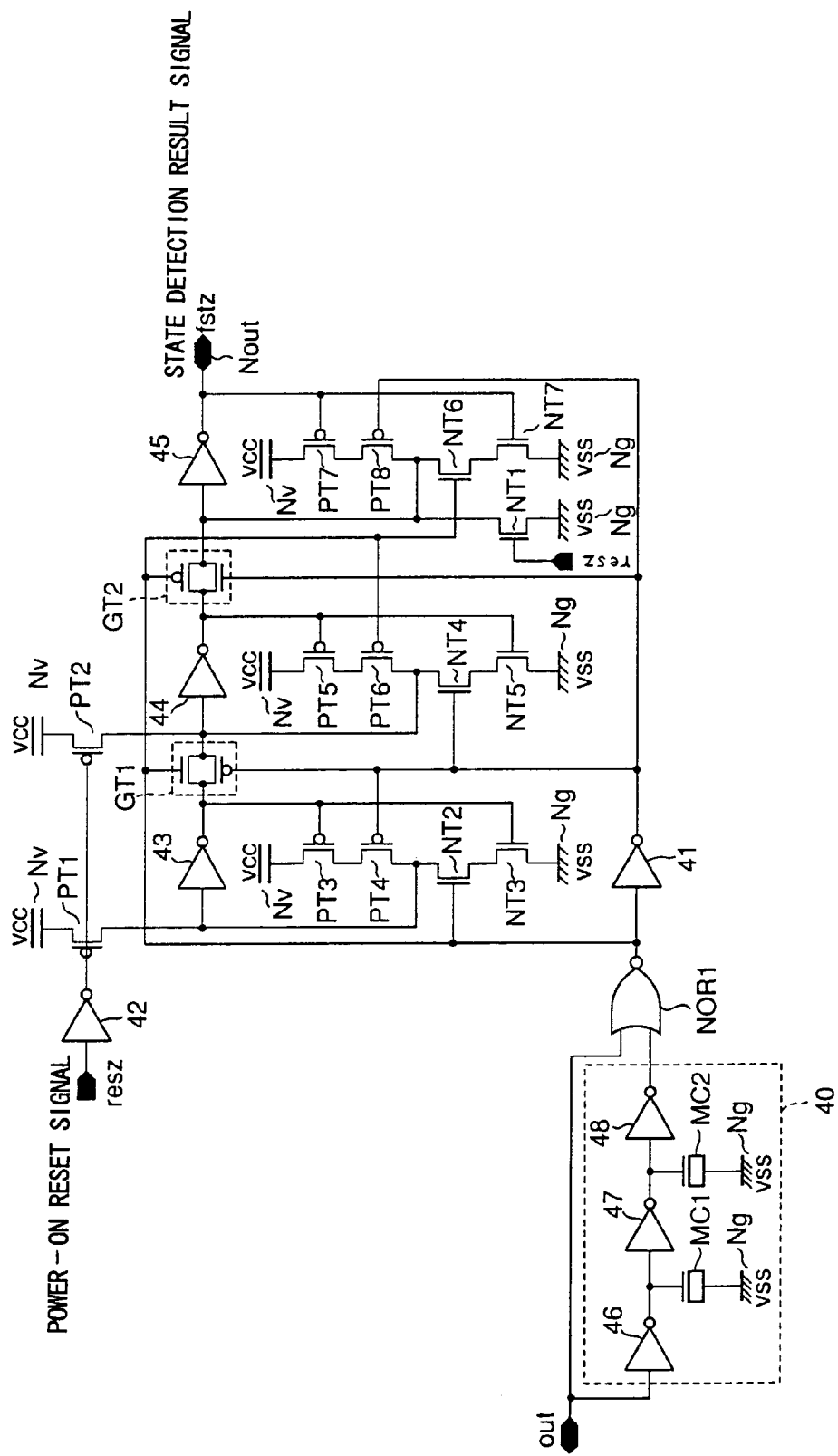
FIG. 11 is a circuit diagram of a state detection circuit shown in FIG. 5.

Next, a description will be given, with reference to FIG. 11, of the state detection circuit 22 shown in FIG. 5. FIG. 11 is a circuit diagram of the state detection circuit 22 shown in FIG. 5. As shown in FIG. 11, the state detection circuit 22 comprises a delay circuit 40, inverters 41 to 45, a NOR circuit NOR1, gates GT1 and GT2, N-channel MOS transistors NT1 to NT7, and P-channel MOS transistors PT1 to PT8. The delay circuit 40 includes serially connected inverters 46 to 48 and MOS capacitors MC1 and MC2.

As shown in FIG. 11, a result signal 'out' is supplied (from the phase comparator 8) to the NOR circuit NOR1 and the delay circuit 40. Therefore, the result signal 'out' and a signal which the delay circuit 40 produces by delaying the result signal 'out' by a predetermined time are input into the NOR circuit NOR1. A power-on reset signal resz, which transits from a low level to a high level when the delay time adjusting circuit according to the present embodiment gets energized, is supplied to an input terminal of the inverter 42 and a gate of the N-channel MOS transistor NT1. A source of the N-channel MOS transistor NT1 is connected to a grounding node Ng. A drain of the N-channel MOS transistor NT1 is connected via the inverter 45 to an output node Nout of the state detection circuit 22.

The gate GT1 connected between the inverter 43 and 44 and the gate GT2 connected between the inverter 44 and 45 are opened or closed depending on an output signal of the NOR circuit NOR1.

Next, a description will be given of an operation of the state detection circuit 22. First, when a power supply is provided, the power-on reset signal resz at a high level is supplied to the gate of the N-channel MOS transistor NT1. Thereby, the N-channel MOS transistor NT1 is on, and a grounding voltage is supplied from the grounding node Ng to the inverter 45. Thereby, the inverter 45 inverts a signal at a low level so that a state detection result signal fstz at a high level is supplied to the output node Nout of the state detection circuit 22.

At this time, since a low-level signal is supplied from the inverter 42 to gates of the P-channel MOS transistors PT1 to PT2, the P-channel MOS transistors PT1 to PT2 become on. Thereby, power supply voltages vcc are supplied from power supply nodes Nv to the inverters 43 and 44 so that a low-level signal is supplied to gates of the N-channel MOS transistor NT3 and NT5. Thereby, the N-channel MOS transistor NT3 and NT5 become off.

As described above, at an initial state, the state detection circuit 22 is deactivated and outputs the state detection result signal fstz fixed at a high level. Then, when the result signal 'out' supplied from the phase comparator 8 changes from a high level to a low level, a low-level signal is input into one input terminal of the NOR circuit NOR1. However, while the result signal 'out' at a low level is transmitted through the delay circuit 40, a low-level signal is still supplied to the other input terminal of the NOR circuit NOR1. Therefore, during this time, the NOR circuit NOR1 outputs a high-level signal.

Thereby, the gates GT1 and GT2 are opened so that an output signal of the inverter 43 at a low level is transmitted through the gate GT1 to the inverter 44. Subsequently, the inverter 44 transmits an output signal at a high level through the gate GT2 to the inverter 45. Accordingly, in this case, a signal at a low level is supplied from the inverter 45 to the output node Nout.

As described above, only when the result signal 'out' supplied from the phase comparator 8 transits from a high level to a low level, the state detection circuit 22 outputs a state detection result signal fstz at a low level.

Figure 12:
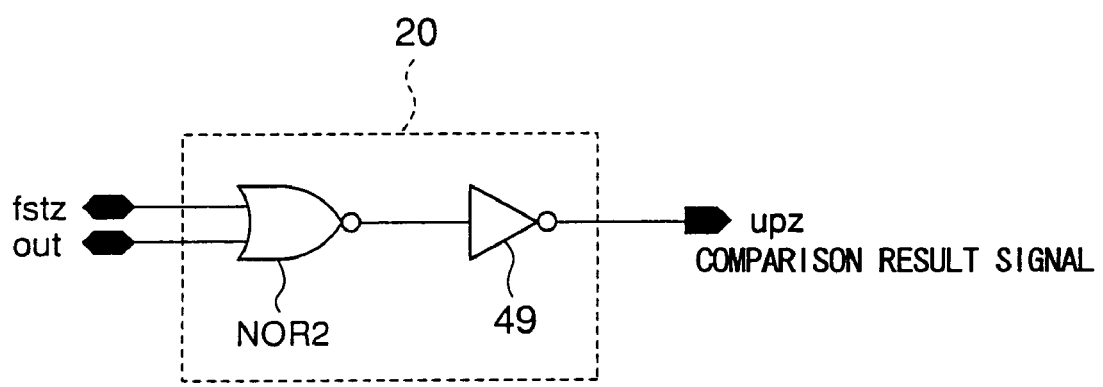
FIG. 12 is a circuit diagram of a state judgment circuit shown in FIG. 5.

Next, a description will be given, with reference to FIG. 12, of the state judgment circuit 20 shown in FIG. 5. FIG. 12 is a circuit diagram of the state judgment circuit 20 shown in FIG. 5. As shown in FIG. 12, the state judgment circuit 20 comprises a NOR circuit NOR2 and an inverter 49 connected thereto. A result signal 'out' supplied from the phase comparator 8 is input into one input terminal of the NOR circuit NOR2. A state detection result signal fstz supplied from the state detection circuit 22 is input into the other input terminal of the NOR circuit NOR2. A comparison result signal upz is supplied from an output terminal of the inverter 49 to the delay adjuster 24.

Next, a description will be given of an operation of the state judgment circuit 20. At an initial state, as described above, since a state detection result signal fstz at a high level is supplied to the NOR circuit NOR2, a low-level signal is continuously supplied to the inverter 49 independent of a logical level of the result signal 'out'. Therefore, a comparison result signal upz at a high level is supplied from the inverter 49 to the delay adjuster 24. It is noted here that, as described above, the delay adjuster 24, when supplied with a comparison result signal upz at a high level, controls the switching unit 31 of the DLL array 7 so as to lengthen a delay time in the DLL array 7, and when supplied with a comparison result signal upz at a low level, controls the switching unit 31 of the DLL array 7 so as to shorten the delay time in the DLL array 7.

The state judgment circuit 20 continues to output the comparison result signal upz at a high level to the delay adjuster 24 until a state detection result signal fstz at a low level is supplied from the state detection circuit 22 to the state judgment circuit 20. Then, when the state detection result signal fstz at a low level is supplied from the state detection circuit 22 to the state judgment circuit 20, since the NOR circuit NOR2 is activated, the state judgment circuit 20 supplies the delay adjuster 24 with a signal at the same logical level as a result signal 'out' supplied from the phase comparator 8 as a comparison result signal upz.

As described above, according to the delay time adjusting circuit of the present embodiment, when a first clock of a delay clock signal dclk is ahead of a first clock of a target clock signal tclk at an initial state, the delay clock signal dclk is further delayed so that the first clock (rise) of the delay clock signal dclk is matched to the first clock (rise) of the target clock signal tclk.

Even in a case where a clock signal has a higher frequency and the DLL array 7 has minimum stages that provide a minimum delay time, when a first clock of a delay clock signal dclk is behind a first clock of a target clock signal tclk, the delay clock signal dclk is further delayed so that the first clock (rise) of the delay clock signal dclk is matched to a second clock (rise) of the target clock signal tclk.

Therefore, even when a clock signal has a higher frequency, a phase of a clock signal can be adjusted easily, avoiding the underflow state which a conventional technology suffers. This allows for expanding an operating-frequency band of a semiconductor integrated circuit.

The present invention is not limited to the specifically disclosed embodiments, and variations and modifications may be made without departing from the scope of the present invention.

The present application is based on Japanese priority application No.2000-046225 filed on Feb. 23, 2000, the entire contents of which are hereby incorporated by reference.

What is claimed is:

1. A delay time adjusting method comprising:
   comparing the phases of an input first periodic signal and an output second periodic signal;
   adjusting a delay time of the input first periodic signal so that a phase of the input first periodic signal and a phase of the output second periodic signal match within a predetermined tolerance, wherein
   when a phase of a predetermined rising edge of said output second periodic signal is behind a phase of a predetermined rising edge of said input first periodic signal, said delay time is adjusted so that said predetermined rising edge of said output second periodic signal matches a rising edge of said input first periodic signal, a phase of the rising edge being behind and nearest to said phase of said predetermined rising edge of said output second periodic signal, and wherein the adjusting of said delay at an initial stage of the adjusting is to increase said delay when starting the step of adjusting of said delay.

2. A delay time adjusting method of adjusting a delay time of an input first periodic signal so that a phase of said input first periodic signal and a phase of an output second periodic signal match each other based on a comparison between phases of said input first periodic signal and said output second periodic signal, the method comprising:
   a first step of judging whether a phase of a predetermined rising edge of said output second periodic signal is behind a phase of a first rising edge of said input first periodic signal; and
   a second step of increasing the delay time to adjust said phase of said output second periodic signal so that, when said phase of said predetermined rising edge is judged to be behind said phase of said first rising edge in said first step, said phase of said predetermined rising edge and a phase of a second rising edge of said input first periodic signal match each other, the second rising edge being one period behind said first rising edge, wherein the step of delaying at an initial stage of adjustment is to increase the delay time when starting the delay time adjustment.

3. A delay time adjusting circuit for adjusting a delay time of an input first periodic signal so that a phase of said input first periodic signal and a phase of an output second periodic signal match each other based on a comparison between phases of said input first periodic signal and said output second periodic signal, the circuit comprising:
   a judging circuit for judging whether a phase of a predetermined rising edge of said output second periodic signal is behind a phase of a predetermined rising edge of said input first periodic signal; and
   a delaying circuit for adjusting said delay time so that, when said phase of said predetermined rising edge of said output second periodic signal is judged to be behind said phase of said predetermined rising edge of said input first periodic signal by said judging circuit, said predetermined rising edge of said output second periodic signal matches a rising edge of said input first periodic signal, a phase of the rising edge being behind and nearest to said phase of said predetermined rising edge of said output second periodic signal, wherein the step of delaying at an initial stage of adjustment is to increase the delay time when starting the delay time adjustment.

4. A delay time adjusting circuit for adjusting a delay time of an input first periodic signal so that a phase of said input first periodic signal and a phase of an output second periodic signal match each other based on a comparison between phases of said input first periodic signal and said output second periodic signal, the circuit comprising:
   a delaying circuit for delaying said input first periodic signal so as to generate said output second periodic signal;
   a phase-detecting circuit for detecting whether a phase of a predetermined rising edge of said output second periodic signal is behind a phase of a first rising edge of said input first periodic signal; and
   an adjusting circuit for controlling said delaying circuit so that, when said phase of said predetermined rising edge is judged to be behind said phase of said first rising edge by said phase-detecting circuit, said delaying circuit delays said phase of said output second periodic signal until said phase of said predetermined rising edge and a phase of a second rising edge of said input first periodic signal match each other, the second rising edge being one period behind said first rising edge, wherein the step of delaying at an initial stage of adjustment is to increase the delay time when starting the delay time adjustment.

5. The delay time adjusting circuit as claimed in claim 4, wherein said adjusting circuit controls said delaying circuit so that, after said phase of said predetermined rising edge and said phase of said second rising edge match each other, said phase of said predetermined rising edge and said phase of said second rising edge match each other all the time within a tolerable range.

* * * * *